(12) United States Patent
Jang

(10) Patent No.: US 8,502,591 B2
(45) Date of Patent: Aug. 6, 2013

(54) HIGH VOLTAGE CONTROL CIRCUIT OF SEMICONDUCTOR DEVICE

(75) Inventor: Chae Kyu Jang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 80 days.

(21) Appl. No.: 13/160,230

(22) Filed: Jun. 14, 2011

(65) Prior Publication Data

US 2012/0007662 A1     Jan. 12, 2012

(30) Foreign Application Priority Data

Jul. 9, 2010 (KR) .......................... 10-2010-0066495
Aug. 4, 2010 (KR) .......................... 10-2010-0075249

(51) Int. Cl.
    *H03L 5/00*       (2006.01)
(52) U.S. Cl.
    USPC ................................. 327/333; 326/61; 326/80
(58) Field of Classification Search
    USPC .................. 326/62–63, 80–82; 327/306, 333
    See application file for complete search history.

(56) References Cited

U.S. PATENT DOCUMENTS

| | | | | |
|---|---|---|---|---|
| 5,659,258 A | * | 8/1997 | Tanabe et al. ................ | 326/68 |
| 6,356,137 B1 | * | 3/2002 | Roohparvar et al. ......... | 327/390 |
| 6,362,663 B1 | * | 3/2002 | Criscione et al. ............. | 327/74 |
| 6,696,880 B2 | * | 2/2004 | Pan et al. ...................... | 327/390 |
| 7,492,206 B2 | * | 2/2009 | Park et al. ..................... | 327/333 |
| 7,592,858 B1 | * | 9/2009 | Jung ............................. | 327/536 |

FOREIGN PATENT DOCUMENTS

| | | |
|---|---|---|
| JP | 2007-158635 | 6/2007 |
| KR | 1020060057960 | 5/2006 |
| KR | 1020060111798 | 10/2006 |
| KR | 1020110078746 | 7/2011 |

OTHER PUBLICATIONS

Notice of Preliminary Rejection issued from Korean Intellectual Property Office on Sep. 26, 2011.
Notice of Allowance issued from Korean Intellectual Property Office on Sep. 24, 2012.

* cited by examiner

*Primary Examiner* — Dinh T. Le
(74) *Attorney, Agent, or Firm* — IP & T Group LLP

(57) ABSTRACT

A high voltage control circuit of a semiconductor device includes an output node control circuit configured to set an initial potential of an output terminal or to discharge the potential of the output terminal, in response to an input signal and a high voltage supply circuit comprising an acceleration unit and a potential control unit coupled in series between the output terminal and a supply terminal for supplying a high voltage. The acceleration unit is operated in response to the potential of the output terminal, and the potential control unit is operated in response to the input signal.

24 Claims, 3 Drawing Sheets

HIGH VOLTAGE CONTROL CIRCUIT OF SEMICONDUCTOR DEVICE

CROSS-REFERENCES TO RELATED APPLICATIONS

Priority to Korean patent application numbers 10-2010-0066495 filed on Jul. 9, 2010 and 10-2010-0075249 filed on Aug. 4, 2010, the entire disclosures of which are incorporated by reference herein, are claimed.

BACKGROUND

Exemplary embodiments relate to a high voltage control circuit of a semiconductor device and, more particularly, to a high voltage control circuit of a semiconductor device which can be driven at a relatively low voltage.

A semiconductor device requires higher pumping voltage than an input power supply voltage, and a high voltage control circuit is required in order to transfer the voltage to pertinent circuits or elements.

FIG. 1 is a circuit diagram of a known high voltage control circuit of a semiconductor device.

Referring to FIG. 1, when an operation of transmitting a high voltage is performed, inverters IV1 and IV2 buffer an input signal A of a high logic level and output the buffered signal as a signal of a high logic level. An NMOS transistor NMOS and a high voltage NMOS transistor HNMOS transmit a signal of a high logic level, outputted from the inverter IV2, to an output terminal NA in response to a first control signal B. Accordingly, the potential of the output terminal NA rises by a potential of the signal of a high logic level. A second control signal C outputted from the inverter IV1 turns on a high voltage PMOS transistor HPMOS. The potential of the output terminal NA is inputted to the gate of a negative voltage transistor NNMOS, which is thus turned on. Accordingly, a high voltage VPP is supplied to the output terminal NA.

When an operation of cutting off the transmission of a high voltage is performed, the inverters IV1 and IV2 buffer the input signal A of a low logic level and output the buffered signal as a signal of a low logic level. The NMOS transistor NMOS and the high voltage NMOS transistor HNMOS are turned on in response to the first control signal B. At this time, the current of the output terminal NA is discharged through the NMOS transistor NMOS, the high voltage NMOS transistor HNMOS, and the inverter IV2.

The known high voltage control circuit is not normally operated in a low voltage device having a power supply voltage of 2.3 V or 1.8 V. This is because in order to turn off the high voltage PMOS transistor HPMOS when the operation of cutting off the transmission of a high voltage is performed, the second control signal C of a high voltage level has to be supplied. Since the second control signal C of 2.3 V or 1.8 V is generated in the low voltage device having the power supply voltage of 2.3 V or 1.8 V, the high voltage PMOS transistor HPMOS is not fully turned off, and some current flows through the high voltage PMOS transistor HPMOS. Accordingly, a potential of 2.5 V or 2.8 V may be transferred to the output terminal NA.

BRIEF SUMMARY

Exemplary embodiments relate to the high voltage control circuit of a semiconductor device, wherein a plurality of transistors for transmitting a high voltage to an output terminal is formed in the high voltage control circuit of a low voltage device using a relatively low power supply voltage, whereby the high voltage can be prevented from being supplied to the output terminal, although the plurality of transistors are not fully turned off by the relatively low power supply voltage in an operation of cutting off the high voltage.

An exemplary high voltage control circuit of a semiconductor device according to an aspect of the present disclosure includes an output node control circuit configured to set an initial potential of an output terminal or to discharge the potential of the output terminal, in response to an input signal and a high voltage supply circuit including an acceleration unit and a potential control unit coupled in series between the output terminal and a supply terminal for supplying a high voltage. The acceleration unit is operated in response to the potential of the output terminal, and the potential control unit is operated in response to the input signal.

When an operation of cutting off the transmission of the high voltage to the output terminal is performed, a threshold voltage value of the potential control unit may prevent a current, supplied through the acceleration unit, from being supplied to the output terminal.

An exemplary high voltage control circuit of a semiconductor device according to another aspect of the present disclosure includes an output node control circuit configured to control a potential of an output terminal and a high voltage supply circuit including a plurality of high voltage transistors coupled in series and configured to transmit a high voltage to the output terminal through the high voltage transistors when an operation of transmitting the high voltage is performed. The high voltage supply circuit cuts off the transmission of the high voltage to the output terminal based on threshold voltages of the high voltage transistors when an operation of cutting off the transmission of the high voltage is performed.

An exemplary high voltage control circuit of a semiconductor device according to yet another aspect of the present disclosure includes an initial node control circuit configured to set the initial potential of an output terminal, a high voltage transmission circuit configured to transmit a high voltage to the output terminal in response to an input signal, and a discharge circuit configured to discharge the voltage of the output terminal after a lapse of a certain time since the input signal is disabled.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
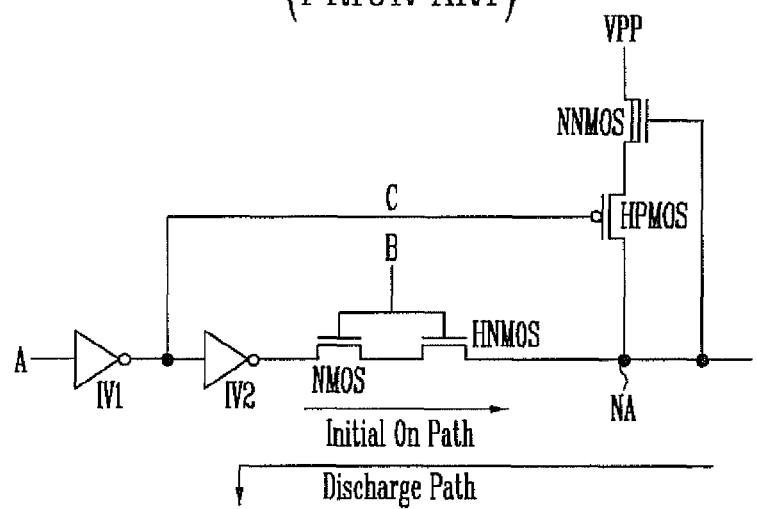
FIG. 1 is a circuit diagram of a known high voltage control circuit of a semiconductor device.
Figure 2:
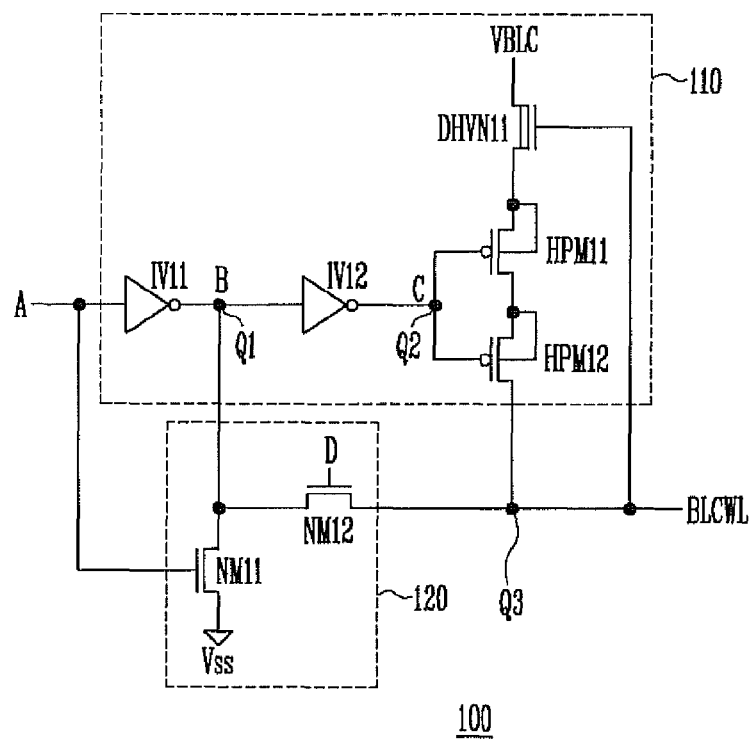
FIG. 2 is a circuit diagram of the high voltage control circuit of a semiconductor device according to an exemplary embodiment of this disclosure.

FIG. 2 is a circuit diagram of the high voltage control circuit of a semiconductor device according to an exemplary embodiment of this disclosure.

Referring to FIG. 2, the high voltage control circuit 100 of a semiconductor device according to an exemplary embodiment of this disclosure includes a high voltage supply circuit 110 and an output node control circuit 120.

The high voltage supply circuit 110 includes a plurality of inverters IV11, IV12, an acceleration unit DHVN11, and potential control units HPM11, HPM12. The acceleration unit DHVN11 is formed of a negative voltage transistor, and the potential control units are formed of respective high voltage PMOS transistors HPM11, HPM12.

The inverter IV11 and the inverter IV12 are coupled in series, The inverter IV11 generates a first control signal B by inverting an input signal A. The inverter IV12 generates a second control signal C by inverting the first control signal B. The negative voltage transistor DHVN11 and the plurality of high voltage PMOS transistors HPM11, HPM12 are coupled in series between a high voltage supply terminal VBLC and an output terminal Q3. The negative voltage transistor DHVN11 is turned on or off according to a potential of the output terminal Q3 and is configured to supply a high voltage, received from the high voltage supply terminal VBLC, to the high voltage PMOS transistor HPM11. The negative voltage transistor DHVN11 is a transistor having a negative threshold voltage value and preferably may be formed of a depletion high voltage NMOS transistor. The plurality of high voltage PMOS transistors HPM11, HPM12 transmit the high voltage, received from the negative voltage transistor DHVN11, to the output terminal Q3 in response to the second control signal C. Although two high voltage PMOS transistors HPM11, HPM12 are shown in FIG. 2, two or more high voltage PMOS transistors may be coupled in series.

The output node control circuit 120 includes a plurality of NMOS transistors NM11 and NM12.

The NMOS transistor NM11 is coupled between a ground power source Vss and a node Q1 between the inverter IV11 and the inverter IV12 and is configured to discharge the potential of the node Q1 in response to the input signal A. The NMOS transistor NM12 is coupled between the node Q1 and the output terminal Q3 and is configured to transmit the potential of the first control signal B to the output terminal Q3 or to discharge the potential of the output terminal Q3 through the NMOS transistor NM11 in response to a third control signal D.

The operation of the high voltage control circuit of a semiconductor device according to the exemplary embodiment of this disclosure is described below with reference to FIG. 2.

An operation of transmitting the high voltage to the output terminal Q3 is first described below.

The input signal A shifts from a high logic level to a low logic level. In response thereto, the inverter IV11 generates the first control signal B of a high logic level, and the inverter IV12 generates the second control signal C of a low logic level. At this time, the third control signal D of a high logic level is supplied, and so the first control signal B is transmitted to the output terminal Q3. Accordingly, the potential of the output terminal Q3 rises to a value in which the threshold voltage value Vth of the NMOS transistor NM12 is subtracted from a potential of the second control signal B. For example, in a low voltage semiconductor device using a power supply voltage of 2.3 V or 1.8 V, the potential of the output terminal Q3 of the low voltage semiconductor device rises to a value in which the threshold voltage value Vth of the NMOS transistor is subtracted from 2.3 V or 1.8 V (i.e., the output terminal Q3 rises to 2.3-Vth or 1.8-Vth).

The negative voltage transistor DHVN11 sends a high voltage, received from the high voltage supply terminal VBLC, to the source of the high voltage PMOS transistor HPM11 in response to the potential of the output terminal Q3. The high voltage PMOS transistor HPM11 and the high voltage PMOS transistor HPM12 are turned on in response to the second control signal C of a low logic level, thus sending the high voltage to the output terminal Q3. Accordingly, the potential of the output terminal Q3 rises higher than an initial potential, thereby increasing the amount of current flowing through the negative voltage transistor DHVN11. Consequently, the potential of the output terminal Q3 gradually rises to the potential of the high voltage received from the high voltage supply terminal VBLC. Next, an output voltage BLCWL of the high voltage is outputted through the output terminal Q3.

When the high voltage transmission operation is changed to an operation of cutting off the transmission of the high voltage, the low logic level of the input signal A shifts to a high logic level. In response thereto, the inverter IV11 generates the second control signal B of a low logic level, and the inverter IV12 generates the third control signal C of a high logic level. At this time, the NMOS transistor NM12 is turned on in response to the third control signal D of a high logic level. Furthermore, the NMOS transistor NM11 is turned on in response to the input signal A of a high logic level. Consequently, the potential of the output terminal Q3 is discharged by the ground power source Vss.

The negative voltage transistor DHVN11 decreases the amount of current of the high voltage, supplied through the high voltage supply terminal VBLC, in response to the potential of the output terminal Q3. For example, in the case where the threshold voltage value of the negative voltage transistor DHVN11 is −2.8 V, a node between the negative voltage transistor DHVN11 and the high voltage PMOS transistor HPM11 has a voltage value of 2.8 V, although the potential of the output terminal Q3 is discharged to 0 V. The high voltage PMOS transistors HPM11, HPM12 should be turned off in response to the second control signal C of a high logic level so that the high voltage supplied to the output terminal Q3 is fully cut off. However, in the case of a semiconductor device using a power supply voltage of 2.3 V or 1.8 V, the potential of the second control signal C has a maximum of 2.3 V or 1.8 V. Accordingly, the high voltage PMOS transistor HPM11 is not fully turned off, but transmits a small amount of a positive current. However, the current passing through the high voltage PMOS transistor HPM11 is cut off by the high voltage PMOS transistor HPM12, and so current is not supplied to the output terminal Q3. In other words, in this embodiment, the plurality of high voltage PMOS transistors for transmitting the high voltage are used to completely block the high voltage supplied to the output terminal Q3 when the operation of cutting off the transmission of the high voltage is performed. Accordingly, the semiconductor device can be stably operated.

The high voltage control circuit of a semiconductor device according to this exemplary embodiment of the disclosure may be used in a block decoder circuit of a flash memory device. That is, the block selection signal BLCWL of a high voltage for selecting a memory block can be switched by using decoding signals of block address signals as the input signal A.

Figure 3:
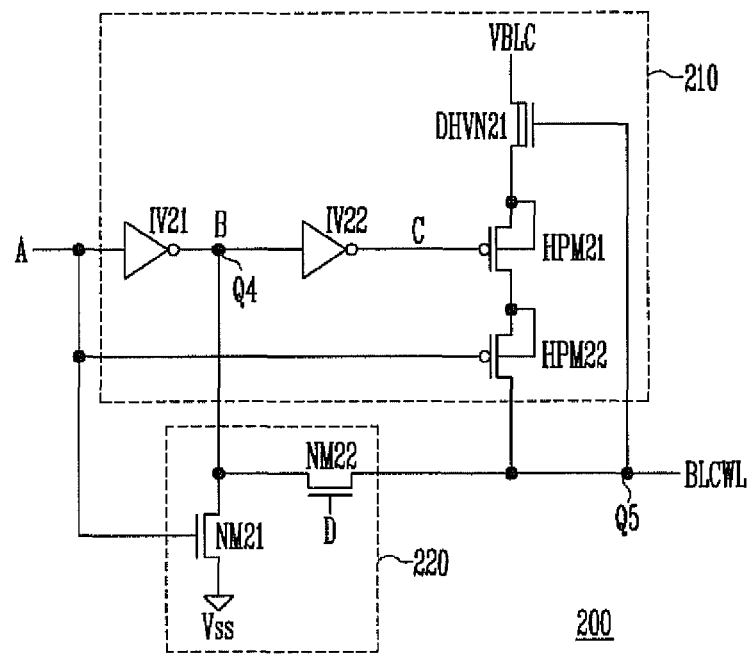
FIG. 3 is a circuit diagram of the high voltage control circuit of a semiconductor device according to another exemplary embodiment of this disclosure.

FIG. 3 is a circuit diagram of the high voltage control circuit of a semiconductor device according to another exemplary embodiment of this disclosure.

Referring to FIG. 3, the high voltage control circuit 200 of a semiconductor device according to another exemplary embodiment of this disclosure includes a high voltage supply circuit 210 and an output node control circuit 220.

The high voltage supply circuit 210 includes a plurality of inverters IV21, IV22, an acceleration unit DHVN21, and potential control units HPM21, HPM22. The acceleration unit is formed of a negative voltage transistor DHVN21, and the potential control units are formed of respective high voltage PMOS transistors HPM21, HPM22.

The inverter IV21 and the inverter IV22 are coupled in series. The inverter IV21 generates a first control signal B by inverting an input signal A. The inverter IV22 generates a second control signal C by inverting the first control signal B. The negative voltage transistor DHVN21 and the plurality of high voltage PMOS transistors HPM21, HPM22 are coupled in series between a high voltage supply terminal VBLC and an output terminal Q5. The negative voltage transistor DHVN21 is turned on or off in response to a potential of the output terminal Q5 and is configured to supply a high voltage, received from the high voltage supply terminal VBLC, to the high voltage PMOS transistor HPM21. The negative voltage transistor DHVN21 is a transistor having a negative threshold voltage value and preferably may be formed of a depletion high voltage NMOS transistor. The high voltage PMOS transistor HPM21 sends the high voltage, received from the negative voltage transistor DHVN21, to the source of the high voltage PMOS transistor HPM22 in response to the second control signal C. The high voltage PMOS transistor HPM22 sends the high voltage, received from the high voltage PMOS transistor HPM21, to the output terminal Q5 in response to the input signal A. Although two high voltage PMOS transistors HPM21, HPM22 are shown in FIG. 3, two or more high voltage PMOS transistors may be coupled in series and operated in response to the second control signal B or the input signal A.

The output node control circuit 220 includes a plurality of NMOS transistor NM21 and NM22.

The NMOS transistor NM21 is coupled between a ground power source Vss and a node Q4 between the inverter IV21 and the inverter IV22 and is configured to discharge the potential of the node Q4 in response to the input signal A. The NMOS transistor NM22 is coupled between the node Q4 and the output terminal Q5 and is configured to transmit the potential of the first control signal B to the output terminal Q5 or to discharge the potential of the output terminal Q5 through the NMOS transistor NM21 in response to a third control signal D.

The operation of the high voltage control circuit of a semiconductor device according to another exemplary embodiment of this disclosure is described below with reference to FIG. 3.

An operation of transmitting the high voltage to the output terminal Q5 is first described below.

The input signal A shifts from a high logic level to a low logic level. In response thereto, the inverter IV21 generates the first control signal B of a high logic level, and the inverter IV22 generates the second control signal C of a low logic level. At this time, the third control signal D of a high logic level is supplied, and so the first control signal B is transmitted to the output terminal Q5. Accordingly, the potential of the output terminal Q5 rises to a value in which the threshold voltage value of the NMOS transistor NM22 is subtracted from the potential of the second control signal B. For example, in a low voltage semiconductor device using a power supply voltage of 2.3 V or 1.8 V, the potential of the output terminal Q5 of the low voltage semiconductor device rises to a value in which the threshold voltage value of the NMOS transistor is subtracted from 2.3 V or 1.8 V.

The negative voltage transistor DHVN21 sends a high voltage, received from the high voltage supply terminal VBLC, to the source of the high voltage PMOS transistor HPM21 in response to the potential of the output terminal Q5. The high voltage PMOS transistor HPM21 and the high voltage PMOS transistor HPM22 are turned on in response to the second control signal C of a low logic level and the input signal, respectively, thus sending the high voltage to the output terminal Q5. Accordingly, the potential of the output terminal Q5 rises higher than an initial potential, thereby increasing the amount of current flowing through the negative voltage transistor DHVN21. Consequently, the potential of the output terminal Q5 gradually rises to the potential of the high voltage received from the high voltage supply terminal VBLC. Next, an output voltage BLCWL of the high voltage is outputted through the output terminal Q5.

When the high voltage transmission operation is changed to an operation of cutting off the transmission of the high voltage, the low logic level of the input signal A shifts to a high logic level. In response thereto, the inverter IV21 generates the second control signal B of a low logic level, and the inverter IV22 generates the third control signal C of a high logic level. At this time, the NMOS transistor NM22 is turned on in response to the third control signal D of a high logic level. Furthermore, the NMOS transistor NM21 is turned on in response to the input signal A of a high logic level. Consequently, the potential of the output terminal Q5 is discharged by the ground power source Vss.

The negative voltage transistor DHVN21 decreases the amount of current of the high voltage, supplied through the high voltage supply terminal VBLC, in response to the potential of the output terminal Q5. For example, in the case where the threshold voltage value of the negative voltage transistor DHVN21 is −2.8 V, a node between the negative voltage transistor DHVN21 and the high voltage PMOS transistor HPM21 has a voltage value of 2.8 V, although the potential of the output terminal Q5 is discharged to 0 V. The high voltage PMOS transistors HPM21, HPM22 should be turned off in response to the second control signal C of a high logic level and the input signal A of a high logic level, respectively, so that the high voltage supplied to the output terminal Q5 is fully cut off. However, in the case of a semiconductor device using a power supply voltage of 2.3 V or 1.8 V, the potential of the second control signal C has a maximum of 2.3 V or 1.8 V. Accordingly, the high voltage PMOS transistor HPM21 is not fully turned off, but transmits a small amount of a positive current. However, the current passing through the high voltage PMOS transistor HPM21 is cut off by the high voltage PMOS transistor HPM22, and so current is not supplied to the output terminal Q5. In other words, in this embodiment, the plurality of high voltage PMOS transistors for transmitting the high voltage are used to completely block the high voltage supplied to the output terminal Q5 when the operation of cutting off the transmission of the high voltage is performed. Accordingly, the semiconductor device can be stably operated.

The high voltage control circuit of a semiconductor device according to this exemplary embodiment of the disclosure may be used in a block decoder circuit of a flash memory device. That is, the block selection signal BLCWL of a high voltage for selecting a memory block can be switched by using decoding signals of block address signals as the input signal A.

Figure 4:
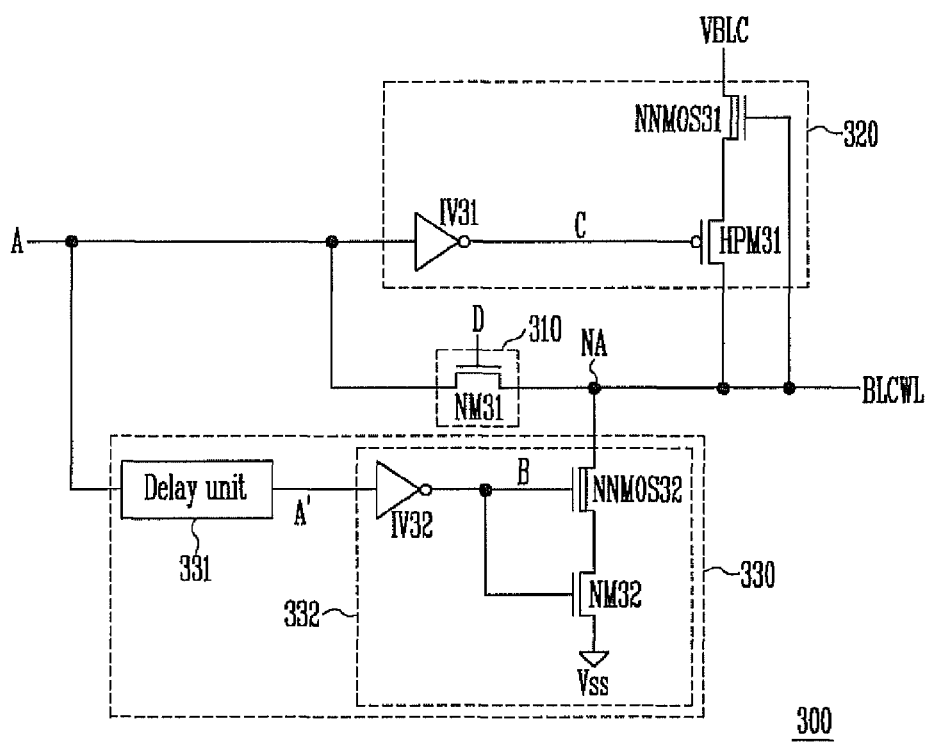
FIG. 4 is a circuit diagram of the high voltage control circuit of a semiconductor device according to yet another exemplary embodiment of this disclosure.

FIG. 4 is a circuit diagram of the high voltage control circuit of a semiconductor device according to yet another exemplary embodiment of this disclosure.

Referring to FIG. 4, the high voltage control circuit 300 of a semiconductor device includes an initial node control circuit 310, a high voltage transmission circuit 320, and a discharge circuit 330.

The initial node control circuit 310 sends an input signal A to an output terminal NA in response to a third control signal D. The initial node control circuit 310 may include an NMOS transistor NM31. Accordingly, the potential of the output terminal NA rises to a value in which the threshold voltage value of the NMOS transistor NM31 is subtracted from a potential of the input signal A.

The high voltage transmission circuit 320 includes an inverter IV31, a negative voltage transistor NNMOS31, and a high voltage PMOS transistor HPM31. The inverter IV31 generates a second control signal C by inverting the input signal A. The negative voltage transistor NNMOS31 and the high voltage PMOS transistor HPM31 are coupled in series between a high voltage supply terminal VBLC and the output terminal NA. The negative voltage transistor NNMOS31 is turned on in response to the potential of the output terminal NA, and the high voltage PMOS transistor HPM31 is turned on in response to the second control signal C. Accordingly, a high voltage from the high voltage supply terminal VBLC is sent to the output terminal NA, and so an output signal BLCWL is generated.

The discharge circuit 330 includes a delay unit 331 and a discharge unit 332.

The delay unit 331 receives the input signal A and generates a delay signal A' by delaying the input signal A by a certain time.

The discharge unit 332 discharges the potential of the output terminal NA in response to the delay signal A'. The discharge unit 332 includes an inverter IV32, a negative voltage transistor NNMOS32, and an NMOS transistor NM32. The inverter IV32 generates the first control signal B by inverting the delay signal A'. The negative voltage transistor NNMOS32 and the NMOS transistor NM32 are coupled in series between the output terminal NA and a ground power source terminal Vss and are turned on in response to the first control signal B. The negative voltage transistor NNMOS32 can have a fast discharge effect because it discharges a large amount of current when an operation of discharging the output terminal NA is performed, as compared with a common NMOS transistor. Furthermore, the negative voltage transistor NNMOS32 functions to prevent voltage from rising although the output terminal NA is subjected to a coupling effect resulting from the output terminal of a neighboring high voltage switch circuit.

The operation of the high voltage control circuit of a semiconductor device according to the exemplary embodiment shown in FIG. 4 is described below with reference to FIG. 4.

Before the input signal A of a high logic level is received, the negative voltage transistor NNMOS32 and the NMOS transistor NM32 of the discharge unit 332 are turned on in response to the first control signal B of a high logic level is supplied, thereby discharging the output terminal NA to a low logic level.

In an operation of transmitting a high voltage, when the input signal A of a high logic level is received, the initial node control circuit 310 sends the input signal A to the output terminal NA in response to the third control signal D. Accordingly, the potential of the output terminal NA rises to a value in which the threshold voltage value of the NMOS transistor NM31 is subtracted from a potential of the input signal A. Furthermore, the inverter IV31 of the high voltage transmission circuit 320 generates the second control signal C of a low logic level. The high voltage PMOS transistor HPM31 is turned on in response to the second control signal C of a low logic level. Since the negative voltage transistor NNMOS31 has a negative threshold voltage value, the negative voltage transistor NNMOS31 sends a certain amount of current to the high voltage PMOS transistor HPM31 in response to the potential of the output terminal NA which has risen to a potential in which the threshold voltage value of the NMOS transistor NM31 is subtracted from the potential of the input signal A. Accordingly, the potential of the output terminal NA gradually rises.

The delay unit 331 receives the input signal A of a high logic level and generates the delay signal A' by delaying the input signal A by a certain time. The inverter IV32 of the discharge unit 332 generates the first control signal B by inverting the delay signal A' of a low logic level. The negative voltage transistor NNMOS32 of the discharge unit 332 is turned on in response to the first control signal B of a high logic level, but the NMOS transistor NM32 is turned off in response to the first control signal B of a low logic level. Accordingly, the output terminal NA is not discharged.

When changing from the operation of transmitting the high voltage to an operation of cutting off the transmission of the high voltage, the high level of the input signal A shifts to a low logic level. In response thereto, the inverter IV31 of the high voltage transmission circuit 320 generates the second control signal C of a high logic level. Accordingly, the high voltage PMOS transistor HPM31 is turned off, thus cutting off the transmission of the high voltage to the output terminal NA.

The delay unit 331 receives the input signal A of a low logic level and generates the delay signal A' by delaying the input signal A by a certain time. The inverter IV32 of the discharge unit 332 generates the first control signal B of a high logic level by inverting the delay signal A'. The negative voltage transistor NNMOS32 and the NMOS transistor NM32 of the discharge unit 332 are turned on in response to the first control signal B of a high logic level, so that the output terminal NA is discharged.

In the case where the input signal A shifts from a high logic level to a low logic level, the transition time of the first control signal B is controlled according to the delay time of the delay unit 331. Accordingly, a point of time when the high voltage transmission circuit 320 performs the operation of transmitting the high voltage to the output terminal NA and a point of time when the discharge circuit 330 performs the operation of discharging the potential of the output terminal NA may be set not to overlap with each other. In other words, because the second control signal C is shifted earlier than the first control signal B, the operation of transmitting the high voltage to the output terminal NA can be stopped before the operation of discharging the potential of the output terminal NA is performed.

Furthermore, the logic level transition times of the second control signal C and the first control signal B may be controlled by controlling the beta ratios of the inverter IV31 of the high voltage transmission circuit 320 and the inverter IV32 of the discharge circuit 330 in order to change an operating point of time for preventing current consumption. That is, the inverter IV32 having a higher beta value than the inverter IV31 may be used so that the second control signal C shifts to a logic level earlier than the first control signal B.

The high voltage control circuit of a semiconductor device according to this exemplary embodiment of the disclosure may be used in a block decoder circuit of a flash memory device. That is, the block selection signal BLCWL of a high voltage for selecting a memory block can be switched by using decoding signals of block address signals as the input signal A.

Figure 5:
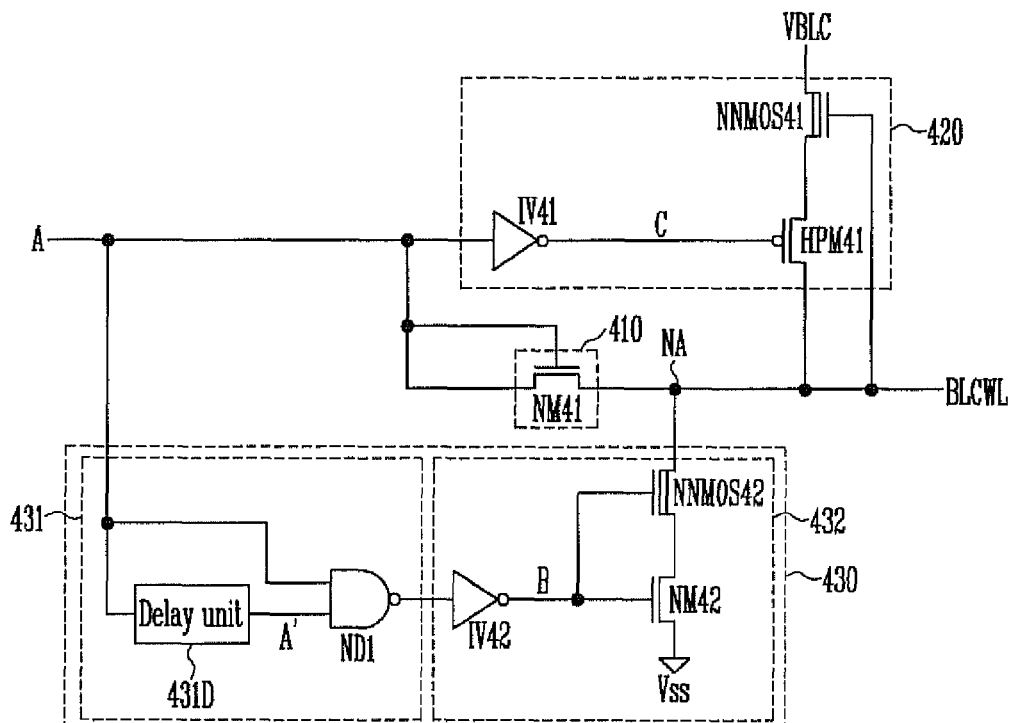
FIG. 5 is a circuit diagram of the high voltage control circuit of a semiconductor device according to still yet another exemplary embodiment of this disclosure.

FIG. 5 is a circuit diagram of the high voltage control circuit of a semiconductor device according to still yet another exemplary embodiment of this disclosure.

Referring to FIG. 5, the high voltage control circuit 400 of a semiconductor device includes an initial node control circuit 410, a high voltage transmission circuit 420, and a discharge circuit 430.

The initial node control circuit 410 sends an input signal A to an output terminal NA in response to the input signal A. The initial node control circuit 410 may be formed of an NMOS transistor NM41. Accordingly, the potential of the output terminal NA rises to a value in which a threshold voltage of the NMOS transistor NM41 is subtracted from a potential of the input signal A.

The high voltage transmission circuit 420 includes an inverter IV41, a negative voltage transistor NNMOS41, and a high voltage PMOS transistor HPM41. The inverter IV41 generates a second control signal C by inverting the input signal A. The negative voltage transistor NNMOS41 and the high voltage PMOS transistor HPM41 are coupled in series between a high voltage supply terminal VBLC and the output terminal NA. The negative voltage transistor NNMOS41 is turned on in response to the potential of the output terminal NA, and the high voltage PMOS transistor HPM41 is turned on in response to the second control signal C. Accordingly, a high voltage from the high voltage supply terminal VBLC is sent to the output terminal NA, and so an output signal BLCWL is generated.

The discharge circuit 430 includes a delay circuit 431 and a discharge unit 432.

The delay circuit 431 includes a delay unit 431D and a NAND gate ND1. The delay unit 431D receives the input signal A and generates a delay signal A' by delaying the input signal A by a certain time. The NAND gate ND1 logically combines the input signal A and the delay signal A' and outputs a result of the combination.

The discharge unit 432 discharges the potential of the output terminal NA in response to the output signal of the delay circuit 431. The discharge unit 432 includes an inverter IV42, a negative voltage transistor NNMOS42, and an NMOS transistor NM42. The inverter IV42 generates a first control signal B by inverting the output signal of the delay circuit 431. The negative voltage transistor NNMOS42 and the NMOS transistor NM42 are coupled in series between the output terminal NA and a ground power source terminal Vss and are turned on in response to the first control signal B. The negative voltage transistor NNMOS42 can have a fast discharge effect because it discharges a large amount of current when an operation of discharging the output terminal NA is performed, as compared with a common NMOS transistor. Furthermore, the negative voltage transistor NNMOS42 functions to prevent voltage from rising although the output terminal NA is subjected to a coupling effect resulting from the output terminal of a neighboring high voltage switch circuit.

The operation of the high voltage control circuit of a semiconductor device according to the exemplary embodiment shown in FIG. 5 is described below with reference to FIG. 5.

Before the input signal A of a high logic level is received, the negative voltage transistor NNMOS42 and the NMOS transistor NM42 of the discharge unit 432 are turned on in response to the first control signal B of a high logic level. Accordingly, the output terminal NA is discharged to a low level.

In an operation of transmitting a high voltage, when the input signal A of a high logic level is received, the initial node control circuit 410 sends the input signal A to the output terminal NA in response to the input signal A. Accordingly, the potential of the output terminal NA rises to a value in which the threshold voltage of the NMOS transistor NM41 is subtracted from a potential of the input signal A. Furthermore, the inverter IV41 of the high voltage transmission circuit 420 generates the second control signal C of a low logic level. The high voltage PMOS transistor HPM41 is turned on in response to the second control signal C of a low logic level. Since the negative voltage transistor NNMOS41 has a negative threshold voltage value, the negative voltage transistor NNMOS41 sends a certain amount of current to the high voltage PMOS transistor HPM41 in response to the potential of the output terminal NA which has risen. Accordingly, the potential of the output terminal NA gradually rises.

The delay circuit 431 receives the input signal A and generates the output signal by delaying the input signal A by a certain time. The inverter IV42 of the discharge unit 432 generates the first control signal B of a low logic level by inverting the output signal of the delay circuit 431. The negative voltage transistor NNMOS42 of the discharge unit 432 is turned on in response to the first control signal B of a high logic level, but the NMOS transistor NM42 is turned off in response to the first control signal B of a low logic level. Accordingly, the output terminal NA is not discharged.

When changing from the operation of transmitting the high voltage to an operation of cutting off the transmission of the high voltage, the high level of the input signal A shifts to a low logic level. In response to the input signal A of a low logic level, the inverter IV41 of the high voltage transmission circuit 420 generates the second control signal C of a high logic level. The high voltage PMOS transistor HPM41 is turned off in response to the second control signal C of a high logic level, so that the transmission of the high voltage to the output terminal NA is cut off.

The delay circuit 431 receives the input signal A and the delay unit 431D of the delay circuit 431 delays the input signal A by a certain time to generate a delay signal A'. Then, the delay circuit 431 logically combines the input signal A with the delay signal A' and outputs a combined signal. For example, the delay circuit 431 may perform a NAND operation on the input signal A and the delay signal A'. The inverter IV42 of the discharge unit 432 generates the first control signal B of a high logic level by inverting the output signal of the delay circuit 431. The negative voltage transistor NNMOS42 and the NMOS transistor NM42 of the discharge unit 432 are turned on in response to the first control signal B of a high logic level, so that the output terminal NA is discharged.

In the case where the input signal A shifts from a high logic level to a low logic level, the transition time of the first control signal B is controlled according to the delay time of the delay unit 431D of the delay circuit 431. Accordingly, a point of time when the high voltage transmission circuit 420 performs the operation of transmitting the high voltage to the output terminal NA and a point of time when the discharge circuit 430 performs the operation of discharging the potential of the output terminal NA may be set not to overlap with each other. In other words, because the second control signal C is shifted earlier than the first control signal B, the operation of transmitting the high voltage to the output terminal NA can be stopped before the operation of discharging the potential of the output terminal NA is performed.

Figure 6:
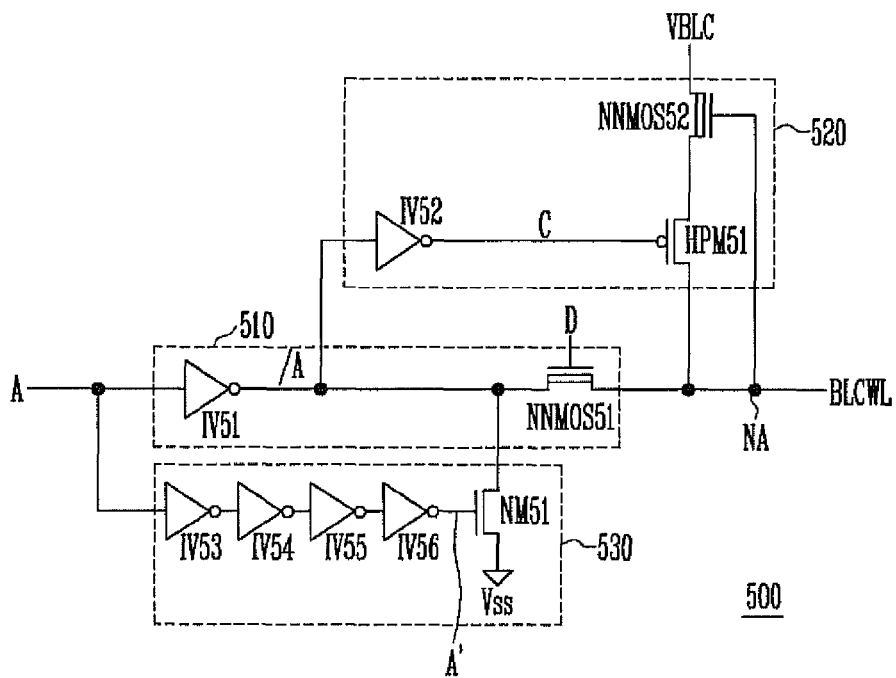
FIG. 6 is a circuit diagram of the high voltage control circuit of a semiconductor device according to still yet another exemplary embodiment of this disclosure.

FIG. 6 is a circuit diagram of the high voltage control circuit of a semiconductor device according to still yet another exemplary embodiment of this disclosure.

Referring to FIG. 6, the high voltage switch circuit 500 includes an initial node control circuit 510, a high voltage transmission circuit 520, and a discharge circuit 530.

The initial node control circuit 510 sends an inverse signal A' of an input signal A to an output terminal NA.

The initial node control circuit 510 includes an inverter IV51 and a negative voltage transistor NNMOS51. The inverter IV51 generates the inverse signal/A by inverting the input signal A. The negative voltage transistor NNMOS51 sends the inverse signal/A to the output terminal NA in response to a third control signal D.

The high voltage transmission circuit 520 includes an inverter IV52, a negative voltage transistor NNMOS52, and a high voltage PMOS transistor HPM51. The inverter IV52 generates a second control signal C by inverting the inverse signal/A. The negative voltage transistor NNMOS52 and the high voltage PMOS transistor HPM51 are coupled in series between a high voltage supply terminal VBLC and the output terminal NA. The negative voltage transistor NNMOS52 is turned on in response to the potential of the output terminal NA, and the high voltage PMOS transistor HPM51 is turned on in response to the second control signal C. Accordingly, a high voltage from the high voltage supply terminal VBLC is sent to the output terminal NA, and so an output signal BLCWL is generated.

The discharge circuit 530 includes a plurality of inverters IV53, IV54, IV55, and IV56 and an NMOS transistor NM51. The inverters IV53, IV54, IV55, and IV56 delay the input signal A to generate a delay signal A' and output the delay signal A' to the gate of the NMOS transistor NM51. The NMOS transistor NM51 is coupled between a ground power source terminal Vss and the output terminal of the inverter IV51. The NMOS transistor NM51 discharges the potential of the output terminal of the inverter IV51 in response to the delay signal A'.

The operation of the high voltage control circuit of a semiconductor device according to the exemplary embodiment shown in FIG. 6 is described below.

First, when the input signal A of a high logic level is received, the NMOS transistor NM51 of the discharge circuit 530 is turned on. At this time, the negative voltage transistor NNMOS51 is turned on in response to the first control signal D of a high logic level. Accordingly, the potential of the output terminal NA is discharged through the negative voltage transistor NNMOS51 and the NMOS transistor NM51.

Next, in an enable operation, when the input signal A of a low logic level is received, the NMOS transistor NM51 of the discharge circuit 530 is turned off, and so the discharge operation of the output terminal NA is terminated. The inverter IV51 generates an output signal of a high logic level by inverting the input signal A.

The high voltage transmission circuit 520 generates the second control signal C of a low logic level in response to the inverse signal/A of a high logic level. The high voltage transistor HPM51 is turned on in response to the second control signal C. Moreover, the negative voltage transistor NNMOS52 is turned on in response to the potential of the output terminal NA. Accordingly, the high voltage transmission circuit 520 transmits the high voltage from the high voltage supply terminal VBLC to the output terminal NA.

After the enable operation is terminated, the input signal A shifts from a low logic level to a high logic level, and so the inverse signal/A of a low logic level is generated. In response thereto, the high voltage transmission circuit 520 is disabled.

Next, the NMOS transistor NM51 of the discharge circuit 530 is turned on in response to a delay signal A', generated by delaying the input signal A for a certain time, and so the potential of the output terminal NA is discharged. Accordingly, the NMOS transistor NM51 performs the discharge operation after the high voltage transmission circuit 520 is disabled.

According to exemplary embodiments of this disclosure, a plurality of transistors for sending a high voltage to an output terminal are used in a high voltage control circuit of a low voltage device using a low power supply voltage. Accordingly, although the plurality of transistors is not fully turned off by the low power supply voltage in an operation of cutting off the high voltage, the high voltage can be prevented from being supplied to the output terminal, and so the device can be stably operated.

What is claimed is:

1. A high voltage control circuit of a semiconductor device, comprising:
    an output node control circuit configured to set an initial potential of an output terminal or to discharge the potential of the output terminal, in response to an input signal; and
    a high voltage supply circuit coupled between the output terminal and a supply terminal for supplying a high voltage,
    wherein the high voltage supply circuit comprises:
    a first inverter configured to generate a first control signal by inverting the input signal;
    a second inverter configured to generate a second control signal by inverting the first control signal;
    an acceleration unit coupled to the supply terminal and configured to control an amount of current of the high voltage in response to the potential of the output terminal; and
    a potential control unit coupled between the acceleration unit and the output terminal and configured to transmit a voltage from the acceleration unit to the output terminal in response to the second control signal.

2. The high voltage control circuit of claim 1, wherein the acceleration unit is a depletion high voltage transistor having a negative threshold voltage value.

3. The high voltage control circuit of claim 1, wherein when an operation of cutting off the transmission of the voltage from the acceleration unit to the output terminal is performed, a threshold voltage value of the potential control unit prevents a current, supplied through the acceleration unit, from being supplied to the output terminal.

4. The high voltage control circuit of claim 1, wherein the output node control circuit comprises:
    a first switch coupled between the output terminal and a node between the first and second inverters and configured to transmit the first control signal to the output terminal in response to a third control signal when an operation of transmitting the high voltage is performed; and
    a second switch coupled between the node between the first and second inverters and a ground power source and configured to discharge the potential of the output terminal in response to the input signal when an operation of cutting off the transmission of the high voltage is performed.

5. The high voltage control circuit of claim 1, wherein the second control signal has a potential of 2.3 V or 1.8 V.

6. A high voltage control circuit of a semiconductor device, comprising:
- an output node control circuit configured to control a potential of an output terminal; and
- a high voltage supply circuit coupled between the output terminal and a supply terminal for supplying a high voltage,
- wherein the high voltage supply circuit comprises:
  - first, second, and third transistors coupled in series between the output terminal and the supply terminal;
  - a first inverter configured to generate a first control signal by inverting an input signal; and
  - a second inverter configured to generate a second control signal by inverting the first control signal,
  - wherein the first transistor is operated in response to the potential of the output terminal, the second transistor is operated in response to the second control signal, and the third transistor is operated in response to the input signal.

7. The high voltage control circuit of claim 6, wherein the high voltage supply circuit comprises first, second, and third transistors coupled in series between the output terminal and a supply terminal for supplying the high voltage.

8. The high voltage control circuit of claim 7, wherein the first transistor is a depletion high voltage transistor having a negative threshold voltage value.

9. The high voltage control circuit of claim 7, wherein when the operation of cutting off the transmission of the high voltage is performed, a current supplied through the first transistor is prevented from being supplied to the output terminal based on the threshold voltages of the second and third transistors.

10. The high voltage control circuit of claim 6,
- wherein the high voltage supply circuit cuts off the transmission of the high voltage to the output terminal based on threshold voltages of the high voltage transistors when an operation of cutting off the transmission of the high voltage is performed.

11. The high voltage control circuit of claim 6, wherein the output node control circuit comprises:
- a fourth transistor coupled between the output terminal and a node between the first and second inverters and configured to transmit the second control signal to the output terminal in response to a third control signal when the operation of transmitting the high voltage is performed; and
- a fifth transistor coupled between the node between the first and second inverters and a ground power source and configured to discharge the potential of the output terminal in response to the input signal when the operation of cutting off the transmission of the high voltage is performed.

12. A high voltage control circuit of a semiconductor device, comprising:
- an initial node control circuit configured to set an initial potential of an output terminal;
- a high voltage transmission circuit configured to transmit a high voltage to the output terminal in response to an input signal; and
- a discharge circuit configured to discharge the voltage of the output terminal after a lapse of a certain time since the input signal is disabled to disable the high voltage transmission circuit by delaying the input signal by the certain time.

13. The high voltage control circuit of claim 12, wherein the initial node control circuit sets the initial potential by transmitting the input signal to the output terminal.

14. The high voltage control circuit of claim 12, wherein the high voltage transmission circuit comprises:
- a first inverter configured to generate a first control signal by inverting the input signal; and
- first and second transistors coupled in series between the output terminal and a terminal for supplying the high voltage and turned on in response to the potential of the output terminal and the first control signal, respectively.

15. The high voltage control circuit of claim 14, wherein the discharge circuit comprises:
- a delay circuit configured to generate an output signal by delaying the input signal by a certain time; and
- a discharge unit configured to generate a second control signal by inverting the output signal of the delay circuit and discharging the potential of the output terminal in response to the second control signal.

16. The high voltage control circuit of claim 15, wherein a logic level of the first control signal shifts earlier than a logic level of the second control signal.

17. The high voltage control circuit of claim 15, wherein the discharge unit comprises:
- a second inverter configured to generate the second control signal by inverting the output signal of the delay circuit; and
- third and fourth transistors coupled in series between the output terminal and a ground power source and turned on in response to the second control signal.

18. The high voltage control circuit of claim 17, wherein the first inverter and the second inverter have different beta ratios.

19. The high voltage control circuit of claim 15, wherein the delay circuit comprises:
- a delay unit configured to generate a delay signal by delaying the input signal by the certain time; and
- a logic gate configured to generate the output signal by logically combining the input signal and the delay signal.

20. The high voltage control circuit of claim 17, wherein each of the first transistor and the third transistor is a negative voltage transistor having a negative threshold voltage value.

21. The high voltage control circuit of claim 12, wherein the initial node control circuit sets the initial potential by sending an inverse signal of the input signal to the output terminal.

22. The high voltage control circuit of claim 21, wherein the high voltage transmission circuit comprises:
- a first inverter configured to generate a first control signal by inverting the inverse signal; and
- first and second transistors coupled in series between the output terminal and a terminal for supplying the high voltage and turned on in response to the first control signal and the potential of the output terminal, respectively.

23. The high voltage control circuit of claim 12, wherein the discharge circuit comprises:
- a delay unit for generating a delay signal by delaying the input signal by a certain time; and
- a discharge unit for discharging the potential of the output terminal in response to the delay signal.

24. The high voltage control circuit of claim 23, wherein the delay unit comprises a plurality of inverters coupled in series.

* * * * *